United States Patent
Nagoya

[11] Patent Number: 5,156,982
[45] Date of Patent: Oct. 20, 1992

[54] PATTERN SHIFT MEASURING METHOD
[75] Inventor: Takatoshi Nagoya, Annaka, Japan
[73] Assignee: Shin-Etsu Handotai Co., Ltd., Tokyo, Japan
[21] Appl. No.: 817,038
[22] Filed: Jan. 3, 1992
[30] Foreign Application Priority Data
  Jan. 10, 1991 [JP] Japan ................ 3-012993
[51] Int. Cl.⁵ .............. H01L 21/00; H01L 21/02
[52] U.S. Cl. ...................... 437/8; 437/225; 356/400; 356/401
[58] Field of Search .......... 437/8, 225; 356/399, 356/400, 401

[56] References Cited
U.S. PATENT DOCUMENTS

| | | | |
|---|---|---|---|
| 4,606,643 | 8/1986 | Tam | 356/401 |
| 4,623,257 | 11/1986 | Feather | 356/400 |
| 4,757,207 | 7/1988 | Chappelow et al. | 356/400 |
| 5,017,514 | 5/1991 | Nishimoto | 437/8 |

Primary Examiner—Brian E. Hearn
Assistant Examiner—Trung Dang
Attorney, Agent, or Firm—Nikaido, Marmelstein, Murray & Oram

[57] ABSTRACT

A method capable of measuring pattern shift of a semiconductor wafer in a short period of time with utmost ease and in an inexpensive manner is disclosed, wherein a main scale pattern and a vernier scale pattern are formed in parallel spaced confrontation on the semiconductor wafer, then one of the main scale pattern and the vernier scale pattern is covered with an oxide film layer, subsequently an epitaxial growing process is performed to form an epitaxial layer over the semiconductor wafer, and after that the dispalcement between the main scale pattern and the vernier scale pattern is measured.

8 Claims, 3 Drawing Sheets

VISUAL FIELD OF MICROSCOPE

RIGHT OBJECTIVE LENS IMAGE — LEFT OBJECTIVE LENS IMAGE

PATTERN SHIFT MEASURING METHOD

BACKGROUND OF THE INVENTION

1. Field of the Invention

The present invention relates to a method of measuring the pattern shift occured in epitaxial growth on a semiconductor wafer with patterns thereon and more particularly to a method of measuring the pattern shift with a high accuracy in a short period of time.

2. Description of the Prior Art

It is essential to control the shift of a buried diffusion pattern after the growth of an epitaxial layer in a bipolar transistor in an IC. For this purpose, the growth conditions (such as reaction temperature and reaction speed) should be always controlled to assure constant pattern shift. However, it is very difficult to control the growth conditions strictly enough to meet the requirement of constant pattern shift because frequent measurement of the pattern shift is inevitable.

Conventionally, the angular polishing and stain etching method is used for this purpose. This method comprises: (1) slicing chips as samples having a buried layer in parallel to and perpendicular to the orientation flat by using a dicing saw; (2) angular polishing of the new narrow surfaces created as sections of the sliced chips; (3) etching the polished surfaces (Sirtl, 2 to 3 seconds); and (4) measuring the shift of the patterns of the buried layers by using differential, interference microscope.

The pattern shift factor is obtained by the following equation:

the pattern shift factor = the amount of shift ($\mu$m)/ the thickness of the epitaxial layer ($\mu$m)

However, since it takes more than three hours to measure the pattern shift, this conventional method cannot be used so frequently and is rather expensive.

SUMMARY OF THE INVENTION

With the foregoing drawbacks of the prior art in view, it is an object of this invention to provide a method which is capable of measuring the pattern shift of a semiconductor wafer in a short period of time with utmost ease, and also is highly accurate and inexpensive.

According to this invention, there is provided a method of measuring pattern shift of a semiconductor wafer, comprising the steps of: forming a main scale pattern and a vernier scale pattern in parallel spaced, confronting relation to one another on the semiconductor wafer; forming an oxide film layer covering either the main scale pattern or the vernier scale pattern; thereafter, performing epitaxial growing process to form an epitaxial layer over the semiconductor wafer; and measuring the displacement of the main scale pattern relative to the vernier scale pattern.

The pattern shift PS of the semiconductor wafer is determined according to the following equation:

$$PS = T/D$$

where D is the measurement representing the displacement of the main scale pattern relative to the vernier scale pattern, and T is the thickness of the epitaxial layer.

It is preferable that simultaneously with the formation of the main scale pattern and the vernier scale pattern, a second main scale pattern and a second vernier scale pattern are formed in parallel spaced, confronting relation to one another on the semiconductor wafer. In this instance, the main scale pattern and the vernier scale pattern extend in a first direction, while the second main scale pattern and the second vernier scale pattern extend in a second direction perpendicular to the first direction. In general, the main scale pattern and the second main scale pattern are covered with the oxide film layer.

Many other objects, advantages and features of the present invention will be better understood from the following description taken in conjunction with the accompanying sheets of drawings.

DETAILED DESCRIPTION OF THE INVENTION

A method of this invention for measuring pattern shift of a semiconductor wafer will be described below in greater detail with reference to the accompanying sheets of drawings.

Figure 1:
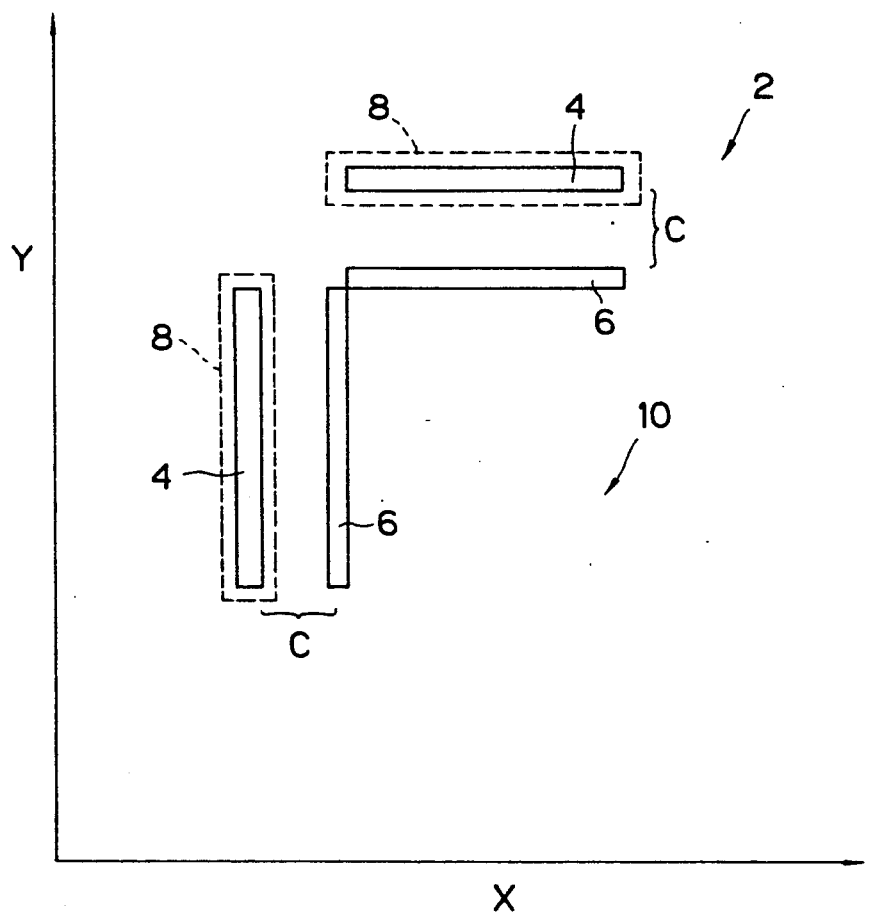
FIG. 1 is a diagrammatical view illustrative of the principle of a method of this invention for measuring the pattern shift of a semiconductor wafer.
Figure 2:
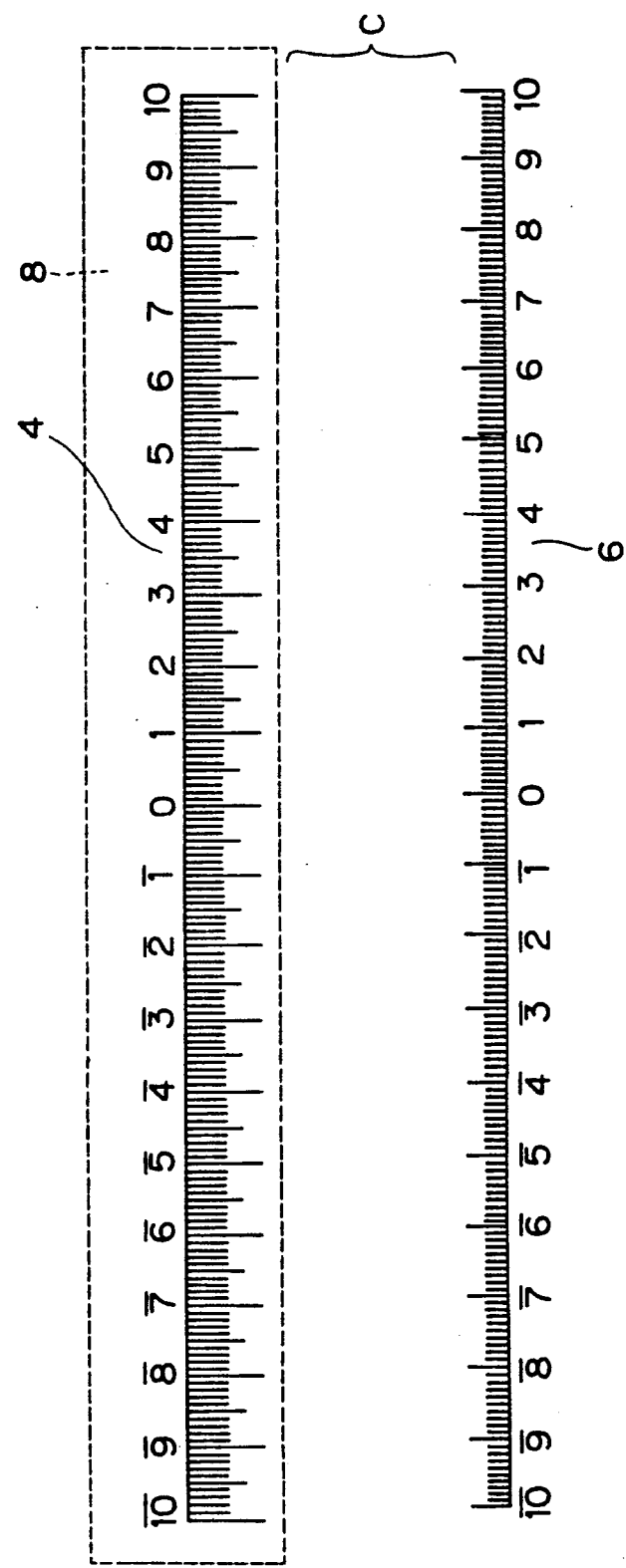
FIG. 2 is an enlarged view of a main portion of FIG. 1.

FIG. 1 diagrammatically shows the principle of the pattern shift measuring method of this invention. In FIG. 1, numeral 2 is a semiconductor wafer having a buried diffusion layer of antimony (Sb). The semiconductor wafer (hereinafter referred to as "buried diffusion wafer") 2 has on its surface a main scale pattern 4 and a vernier scale pattern 6 which are formed previously in parallel spaced confronting relation to one another with a predetermined space therebetween. The main scale pattern 4 and the vernier scale pattern 6 are formed by using a conventional photolithography which is performed with respect to a semiconductor wafer in the order of: resist coating; pattern printing; developing; etching; resist stripping; and cleaning. The main scale pattern 4 and the vernier scale pattern 6 are provided in pair and, preferably, two such pairs of main and vernier scale patterns 4 and 6 are disposed as shown in FIG. 1, so as to ensure that both of the displacement of the semiconductor wafer 2 in the direction of X axis and the displacement of the semiconductor wafer 2 in the direction of Y axis can be measured. To this end, one of the two pairs of main and vernier scale patterns 4, 6 extends in a direction parallel to the X axis, while the other pair extends in a direction parallel to the Y axis which is perpendicular to the X axis.

The semiconductor wafer with the scale patterns 4 and 6 thus formed is diffused with antimony (Sb), whereby the buried diffusion wafer 2 specified above is fabricated. After an oxide film of the buried diffusion wafer 2 is removed by hydrofluoric acid, the buried diffusion wafer 2 is oxidized so as to form an oxide film having a thickness not less than 2000 Å. The oxide film thus formed is selectively removed by photolithography using a desired mask pattern so that the main scale patterns 4 are covered with masking oxide film layers 8. The masking oxide film layers 8 may be formed to cover the vernier scale patterns 6 instead of the main scale patterns 4, however, in general, they are provided over the main scale patterns 4.

The buried diffusion wafer 2 partly covered with the masking oxide film layers 8 extending over the main scale patterns 4 is then subjected to an epitaxial growing process to form an epitaxial layer on the buried diffusion wafer 2. The scale patterns 4, 6 used herein is advantageous for a subsequent measurement of pattern shift because the masking oxide film layers 8 are in tight contact with a surface of the semiconductor wafer and hence deposition of silicon comes out upto side edges of the masking oxide film layers.

The epitaxial growth does not appear at a portion of the semiconductor wafer 2 which is covered with the masking oxide film layers 8. The epitaxial growth appears at a portion of the semiconductor wafer 2 which is devoid of the masking oxide film layers 8. With the epitaxial growing process of this nature, an epitaxial layer 10 shown in FIG. 1 is formed.

As a result of formation of the epitaxial layer 10, a portion semiconductor wafer 2 which includes each of the vernier scale patterns 6 devoid of the oxide film layers 8 is displaced or shifted in position, while a portion of the semiconductor wafer 2 which includes each of the main scale patterns 4 covered with the oxide film layers 8 is free from displacement or shift.

Figure 4:
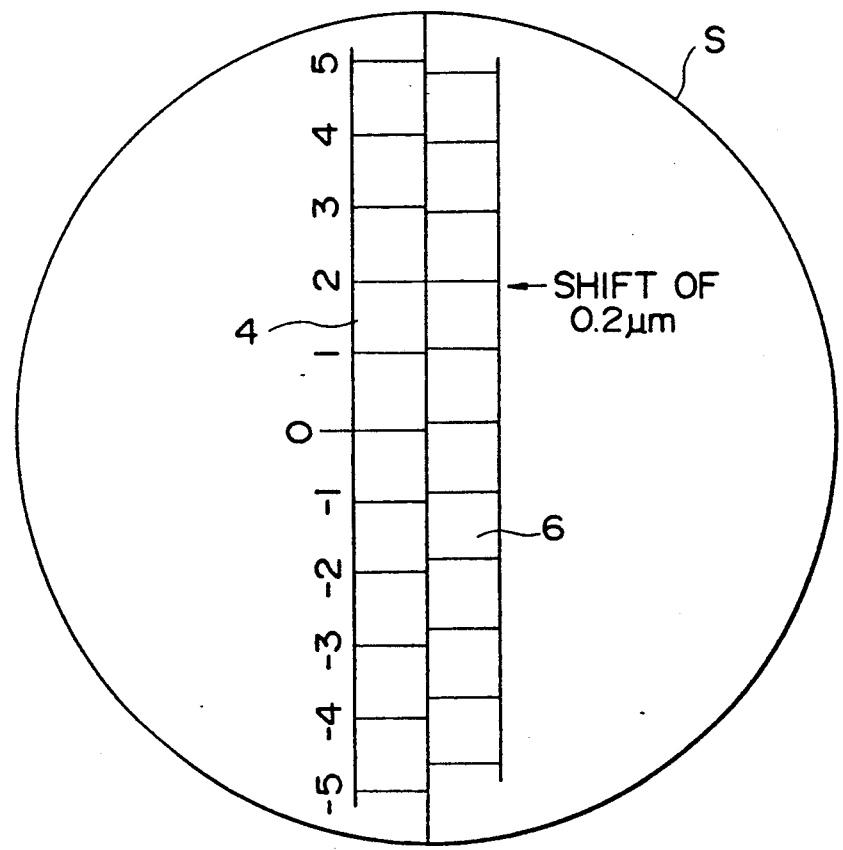
FIG. 4 is a view illustrative of a visual field of the dual objective microscope indicating the displacement of the main scale pattern relative to the vernier scale pattern.

A measurement on the displacement which is calculated from the counts of the divisions to the divisional line of the vernier scale pattern 6 which is the closest to an adjacent divisional line of the main scale pattern 4 is represented by D. The measurement D of displacement is visually determined while the main scale pattern 4 and the vernier scale pattern 4 are positioned within a same visual field. More concretely, a dual objective microscope is used as a measuring means or instrument suitable for this purpose. During such measurement, an angle of rotation of a specimen must be adjusted such that a line connecting respective optical axes of the left and right objective lenses extends perpendicular to graduation lines (scale marks) of the scale patterns 4, 6. The adjustment of the specimen's rotation angle can be accomplished by using the graduation lines of another combination of the main and vernier scale patterns 4 and 6. In the case where the dual objective microscope is used as shown in FIG. 4, for example, a measurement D on the displacement can be read as 0.2 $\mu$m within a visual field S of the microscope.

Reference character C denotes a crown formed in the epitaxial deposition process at a boundary portion between the oxide film layer and the silicon substrate. The crown C is formed in a region extending along the oxide film layer 8 and having a width of from 300 to 400 $\mu$m, so that an accurate measurement of the pattern shift is not possible at this region. Taking the formation of the crown C into account, the main scale pattern 4 and the vernier scale pattern 6 are spaced by at least 400 $\mu$m.

The measurement on the displacement between the main scale pattern 4 and the vernier scale pattern 6, and the thickness of the epitaxial layer 10 are used to determine the pattern shift of the semiconductor wafer 2. The pattern shift PS is obtained by the following equation:

$$PS = D/T$$

where D is the measurement on the displacement read out from a combination of the main scale and the vernier scale, and T is the thickness of the epitaxial layer.

Pattern shift measurement was performed under the following conditions.

(1) Semiconductor Wafer Used:
CZ p-type semiconductor wafer <111>,
off-angle 3° 30' in <112>

(2) Photomask Used for Formation of Scale Patterns:
Photomask having a series of identical patterns of 5 mm square cells in which a main scale with a pitch of 10 $\mu$m and a vernier scale with a pitch of 9.9 $\mu$m are paired in parallel spaced confrontation, and two such main and vernier scale pairs are arranged in perpendicular relation to one another as shown in FIG. 1. The line width used to draw the main and vernier scales was 3 $\mu$m.

(3) Forming of Scale Patterns:
The semiconductor wafer specified in the preceding paragraphs (1) was thermally oxidized to form thereon an oxide film having a thickness of 10,000 Å. Then, by a conventional photolithography using the photomask specified in the preceding paragraph (2), the oxide film was partly removed to solely expose graduation lines of the respective scales, and after that an oxide film having a thickness of about 3,000 Å was formed by thermal oxidization on the silicone substrate to cover the graduation lines of the main and vernier scales. As a result, scale patterns having a line width of 3 $\mu$m and a depth of about 1,500 Å were engraved in the semiconductor wafer.

(4) Photolithography (Covering of Main Scale Patterns):
The oxide film on the substrate was removed by buffered hydrofluoric acid and, subsequently, an oxide film having a thickness of 6,000 Å was formed by thermal oxidization process. Thereafter, by using a conventional photolithography, oxide film patterns covering the main scale patterns were formed.

Figure 3:
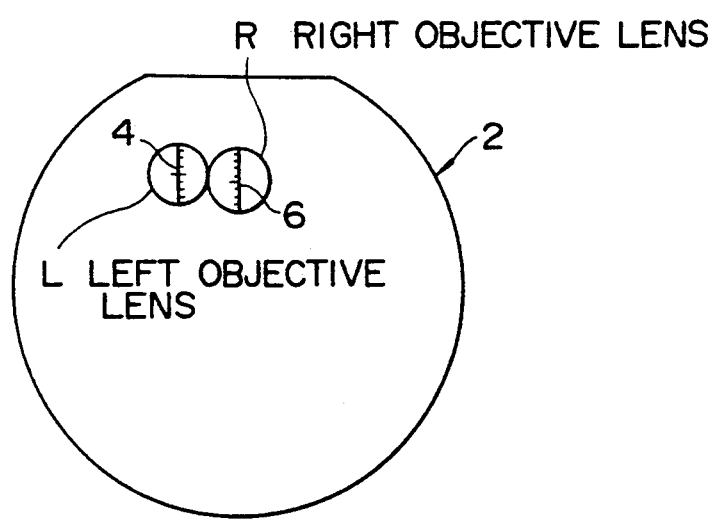
FIG. 3 is a diagrammatical view showing the position of objective lens of a dual objective microscope used for the measurement of the displacement of a main scale pattern and a vernier scale pattern.

(5) Epitaxial Layer Growth:
10 $\mu$m, 1.6$\Omega$-cm
Reaction furnace used: Cylindrical furnace
Reaction Temperature: 1,150° C.
Reaction speed: 0.3 $\mu$m/min
Reaction Pressure: 760 Torr (6) Measurement:
Using a dual objective microscope, a left objective lens L of the microscope was aligned with the main scale pattern 4, while the right objective lens R was aligned with the vernier scale pattern 6 (FIG. 3). In that instance, the main scale pattern 4 and the vernier scale pattern 6 observed in a visual field S of the microscope were disposed in close juxtaposition with each other, as shown in FIG. 4. The displacement of the main scale pattern 4 relative to the vernier scale pattern 6 was measured by observation through the visual field S of the microscope. As shown in FIG. 4, the displacement (i.e., pattern shift) thus measured was 0.2 $\mu$m. The measurement was repeated 75 times, and the dispersion of measurements obtained at that time was represented by a standard deviation of 0.04 $\mu$m.

For comparative purposes, a semiconductor wafer of the same kind as described above was used for measurement of pattern shift by using the conventional method (angular lapping and stain method). A measurement representing the pattern shift was 0.2 $\mu$m, while measurements obtained by a pattern shift measurement repeated 75 times had a standard deviation of 0.41 μm.

It is evident from the foregoing results of experiment that the method of this invention is able to measure the pattern shift accurately in a considerably simple manner as compared to the conventional method.

In the embodiment of this invention described above, the scale patterns are formed by partial oxidization. However, the scale patterns may be engraved by diffusing antimony (Sb), boron (B), phosphorous (P) and arsenic (As) in an oxidizing atmosphere.

According to this invention, it is possible to measure the pattern shift of epitaxial semiconductor wafer in a short period of time, with utmost ease and accuracy, and in an inexpensive manner.

What is claimed is:

1. A method of measuring pattern shift of a semiconductor wafer, comprising the steps of:
    forming a main scale pattern and a vernier scale pattern in parallel spaced, confronting relation to one another on the semiconductor wafer;
    forming an oxide film layer covering either said main scale pattern or said vernier scale pattern;
    thereafter, performing epitaxial growing process to form an epitaxial layer over said semiconductor wafer; and
    measuring the displacement of said main scale pattern relative to said vernier scale pattern.

2. A method according to claim 1, wherein said main scale pattern and said vernier scale pattern are spaced by at least 400 μm.

3. A method according to claim 1, wherein said main scale pattern is covered with said oxide film layer.

4. A method according to claim 1, wherein pattern shift PS of said semiconductor wafer is determined according to the following equation:

$$PS = T/D$$

where D is the measurement representing the displacement of said main scale pattern relative to said vernier scale pattern, and T is the thickness of said epitaxial layer.

5. A method according to claim 1, wherein simultaneously with the formation of said main scale pattern and said vernier scale pattern, a second main scale pattern and a second vernier scale pattern are formed in parallel spaced, confronting relation to one another on the semiconductor wafer, said main scale pattern and said vernier scale pattern extending in a first direction, said second main scale pattern and said second vernier scale pattern extending in a second direction perpendicular to said first direction.

6. A method according to claim 5, wherein said main scale pattern and said second main scale pattern are spaced, respectively, from said vernier scale pattern and said second vernier pattern by at least 400 μm.

7. A method according to claim 5, wherein said main scale pattern and said second main scale pattern are covered with said oxide film layer.

8. A method according to claim 5, wherein pattern shift PS of said semiconductor wafer in each of said first and second directions is determined according to the following equation:

$$PS = T/D$$

where D is the measurement representing the displacement in said first direction of said main scale pattern relative to said vernier scale pattern or the measurement representing the displacement in said second direction of said second main scale pattern relative to said second vernier scale pattern, and T is the thickness of said epitaxial layer.

* * * * *

UNITED STATES PATENT AND TRADEMARK OFFICE
CERTIFICATE OF CORRECTION

PATENT NO. : 5,156,982
DATED : October 20, 1992
INVENTOR(S): Takatoshi NAGOYA

It is certified that error appears in the above-identified patent and that said Letters Patent is hereby corrected as shown below:

Column 1, line 60, delete "$PS=T/D$" and substitute therefor -- $PS=D/T$ --.

In the claims, Column 6, line 1, delete "$PS=T/D$" and substitute therefor -- $PS=D/T$ --; and line 28, delete "$PS=T/D$" and substitute therefor -- $PS=D/T$ --.

Signed and Sealed this

First Day of November, 1994

BRUCE LEHMAN

*Attest:*

*Attesting Officer*    *Commissioner of Patents and Trademarks*